United States Patent
Pratt

(10) Patent No.: US 10,163,236 B1
(45) Date of Patent: Dec. 25, 2018

(54) VISUALIZATION OF DATA VIA MANIPULATION OF AN OBJECT REPRESENTING THE DATA

(71) Applicant: Patricia D. Pratt, Redondo Beach, CA (US)

(72) Inventor: Patricia D. Pratt, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/445,537

(22) Filed: Feb. 28, 2017

Related U.S. Application Data

(60) Provisional application No. 62/304,004, filed on Mar. 4, 2016.

(51) Int. Cl.
*G06T 11/20* (2006.01)
*G06T 19/00* (2011.01)
*G06T 15/50* (2011.01)

(52) U.S. Cl.
CPC .......... *G06T 11/206* (2013.01); *G06T 15/506* (2013.01); *G06T 19/00* (2013.01)

(58) Field of Classification Search
CPC ................ G06F 17/50; G06F 17/5004; G06F 17/5009–17/504; G06F 17/5086; G06F 2217/12; G06F 2217/16; G06T 11/206
See application file for complete search history.

(56) References Cited

U.S. PATENT DOCUMENTS

| | | | | |
|---|---|---|---|---|
| 8,886,497 B1* | 11/2014 | Vold | ........................ | G06F 17/13 703/2 |
| 9,047,705 B1* | 6/2015 | Ko | ........................... | G06T 13/20 |
| 2013/0325417 A1* | 12/2013 | Hallquist | ............ | G06F 17/5018 703/2 |
| 2015/0142150 A1* | 5/2015 | Layman | ................. | A61F 2/5046 700/98 |
| 2017/0046462 A1* | 2/2017 | Pado | ................... | G01M 5/0033 |
| 2017/0075340 A1* | 3/2017 | Claeys | ..................... | G06F 17/50 |
| 2017/0180756 A1* | 6/2017 | Tuffreau | ............ | H04N 13/0048 |
| 2017/0242955 A1* | 8/2017 | Ono | ..................... | G06F 17/5072 |

* cited by examiner

*Primary Examiner* — Diane M Wills
(74) *Attorney, Agent, or Firm* — Tarolli, Sundheim, Covell & Tummino LLP

(57) ABSTRACT

Systems and methods are provided for analyzing large data sets. A source interface receives a data set representing at least two independent variables and at least one dependent variable. A modeling component defines a three-dimensional structure representing the data set and instantiates the structure as an object. The object is defined to have non-infinitesimal dimensions in all directions and defined material properties with at least one of a dimension of the object and a material property of the object being a function of the dependent variable. A structural engineering component manipulates the object to facilitate review of the data set represented by the object via one of a kinematic perturbation and application of a structural engineering tool to the object or directly applying mathematical methods to achieve similar results once the cognitive challenge is met by structurally organizing the data.

20 Claims, 3 Drawing Sheets

VISUALIZATION OF DATA VIA MANIPULATION OF AN OBJECT REPRESENTING THE DATA

RELATED APPLICATIONS

This application claims priority from U.S. Provisional Application Ser. No. 62/304,004, filed 4 Mar. 2016, which is incorporated herein in its entirety.

TECHNICAL FIELD

The present invention relates generally to data visualization, and more particularly to visualization of virtual data via manipulation of tangible or virtual objects representing the data set.

BACKGROUND

A primary goal of data visualization is to communicate information clearly and efficiently to users via the statistical graphics, plots, information graphics, tables, and charts selected. Effective visualization helps users in analyzing and reasoning about data and evidence. It makes complex data more accessible, understandable, and usable. Users may have particular analytical tasks, such as making comparisons or understanding causality, and the design principle of the graphic follows the task. Tables are generally used where users will look-up a specific measure of a variable, while charts of various types are used to show patterns or relationships in the data for one or more variables. The rate at which data is generated has increased, driven by an increasingly information-based economy. Processing, analyzing and communicating this data present a variety of challenges for data visualization.

SUMMARY OF THE INVENTION

In accordance with an aspect of the present invention, a system is provided for analyzing large data sets. A source interface receives a data set representing at least two independent variables and at least one dependent variable. A modeling component defines a three-dimensional structure representing the data set and instantiates the defined three-dimensional structure as an object comprising one of a virtual object and a physical object. The object is defined to have non-infinitesimal dimensions in all directions and defined material properties with at least one of a dimension of the object and a material property of the object being a function of the at least one dependent variable. An object manipulation component manipulates the object to facilitate review of the data set represented by the object by a human being via one of a kinematic perturbation and application of a structural engineering tool to the object.

In accordance with another aspect of the invention, a method is provided for analyzing large data sets. A virtual structure is defined representing a large data set, such that the virtual structure has non-infinitesimal dimensions in all directions and defined material properties. At least one of a dimension of the virtual structure and a material property of the virtual structure is a function of a parameter associated with the data set. The virtual structure is instantiated in structural engineering software. At least one structural engineering tool from the structural engineering software is applied to the virtual structure to facilitate review of the data set by a human being at an associated display.

In accordance with still another aspect of the invention, a method is provided for analyzing large data sets. A structure representing a large data set is defined such that the structure has non-infinitesimal dimensions in all directions and defined material properties. At least one of a dimension of the structure and a material property of the structure is a function of a parameter associated with the data set. The structure is instantiated as one of a virtual object in a software program and a physical object. A vibration is applied to the structure at a selected frequency, and the vibrating structure is reviewed to identify anomalies within the data set.

DETAILED DESCRIPTION

While descriptive statistics and tactical decision making systems can assist a human being by summarizing data, it is difficult for a human being to engage directly with large data sets. To facilitate the review of such data sets, systems and methods described herein import raw data, from an arbitrary source, with multiple parameters and values and transforms the data into a virtual representation of a solid physical object. This conditions the data for immediate and nearly instantaneous analysis such as calculation of an area under the curve or the centroid of the data. Data that is expected to be uniform, such as calibration diagnostics of detectors, can be immediately evaluated for anomalous behavior with structural analysis tools used for modeling physical objects, such as finite element modeling, or independent programs similar to such tools, despite the fact that the visual representation in the software is not in reality a physical object. This allows for ready identification of outliers within the dataset, which can be rejected or selected based on end user needs.

Figure 1:
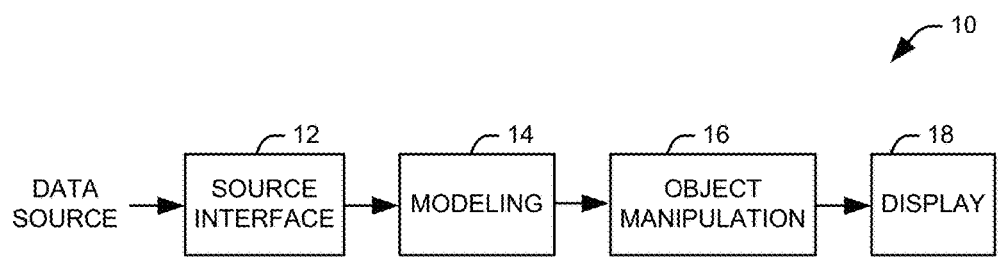
FIG. 1 illustrates one example of a system for displaying large data sets to users as virtual objects.

FIG. 1 illustrates one example of a system 10 for displaying large data sets to users as virtual objects. It will be appreciated that the system 10 can be implemented as dedicated hardware, such as an application specific integrated circuit, firmware on a dedicated hardware device, or as software or programmable digital logic. In one implementation, the system could be implemented as a content addressable memory (CAM) in a field programmable gate array (FPGA) or similar device. Alternatively, the system could be implemented as software instructions and executed by a general purpose processor.

In the present example, the system 10 includes a source interface 12 configured to receive a large data set. In one example, the data set is provided in the form of a plurality of ordered triplets, representing two independent variables and a dependent variable, although it will be appreciated that the data could be provided as ordered n-tuples, having additional independent or dependent variables, as will be discussed below.

A modeling component 14 is configured to define an object representing the large data set, with the object having non-infinitesimal dimensions in all directions and defined material properties. For example, the material properties can include stiffness or elasticity of the material, a melting point, optical properties, such as an index of refraction or a reflectivity for various wavelengths. In one implementation, the modeling component 14 can create a three-dimensional object, such as a rectangular prism, a sphere or ellipsoid, or other such figure, and establish a coordinate system on a surface of the object representing the independent variables. Examples of useful coordinate systems can include a rectangular coordinate system for a rectangular prism, a geographic coordinate system (i.e., a latitude-longitude system) for use on a sphere, and a polar or cylindrical coordinate system. In another implementation, the coordinate system can be defined throughout the volume of the object, with the coordinate system defined over three independent variables. The shape and scale of the structure is selected specifically to best represent the context of the data including n-dimensional parameters and may require creativity on the part of an analyst to select an appropriately configured structure. Certain structures are well suited for many standard contexts, such as data that is latitude and longitude oriented.

It will be appreciated that the shape of the object and the specific coordinate system can be determined according to a characteristic of the data set, either by a human operator or by the modeling component 14. In one example, the modeling component 14 can select the shape and coordinate system according to a data source providing the data set. In another implementation, a scale of the coordinate system can be determined, such that a distance between elements on the surface can be tuned to a specific application. Further, dimensions of the object can be determined according to a desired analysis to be performed. For example, where vibration testing is applied to the object, the thickness of the base of the structure can be selected such that the structure is sufficiently sturdy to withstand the applied force. Similarly, the material or optical properties of the object can be set relative to the base structure, either via material selection or definition in a model for a virtual object, to ensure that a desired response to applied forces can be realized. Patterns indicative of data elements will inherently arise in the visualization without any additional configuring as the mathematical representation of the action imposed by the vibration is done visually. Later as these methods are validated and subsequently coded, a visualization would be easy to retrieve since the data and applied mathematical methods originate from the organization of the structure itself.

It will be appreciated that one or more of the dimensions, material properties, and the optical properties of the object can be defined according to values in the data set, specifically the dependent variables. Accordingly, either or both of the dimensions of the object and its material properties can vary across the surface or volume of the object to reflect the value of one or more dependent variables in each ordered n-tuple at a position on or in the object representing the values of the independent variables in the n-tuple. In one example, a multitude of dependent variables can be collocated in physical space thus allowing the comparisons and analytics additional options to function and operate on between a variety of dimensions in one contextual visualization of the convoluted data.

The defined object is then provided to an object manipulation component 16. For example, the object manipulation component 16 can include a finite element modeling (FEM) system or other appropriate structural engineering tool for utilizing knowledge of loads, physics, and materials to understand and predict how structures support and resist self-weight and imposed loads or other perturbations. Alternatively, the object manipulation component 16 can be an independent program for manipulating the virtual object that is coded in a language such as C, C# or python exactly to perform the applications inside such a program.

In one implementation, the object manipulation component 16 is utilized to apply a kinematic perturbation to the virtual object. By a "kinematic perturbation," it is meant that the object is translated, rotated, vibrated, or otherwise made the subject of an applied force or acceleration. Alternatively, the object manipulation component 16 can apply any of a number of structural analysis tools to the object. In one example, determination of the centroids of multiple objects, representing respective data sets, can be employed to determine if one of the data sets is anomalous, for example, due to an error in a sensor system producing the data set.

The output of the object manipulation component 16 can be provided to an associated display 18. In addition to the kinematic perturbation described above, various tools similar to those available in structural engineering software can be employed to manipulate an instantiation of the virtual structure to facilitate review of the data set by a human being. In an alternate implementation, the display 18 can be replaced or supplemented by a three-dimensional printer or other rapid prototyping technology used at the modeling component 14 to provide a tangible representation of the virtual object for review and manipulation. In such a case, for example, the object manipulation component 16 could include, for example, an electrodynamic shaker or ultrasonic transducer to apply a controlled vibration to the object.

In one example, points on the data sets are represented as a vertical bars rising to a height above the surface proportional to the value of the dependent variable. The x and y dimensions can be unit vectors equal to one or incorporated as one of the features in this tool by allowing the x, y or both axes to vary with another parameter. Each bar is located at the coordinates on the surface associated with the independent variables of its ordered triplet. In such a case, the instantiation of the virtual object can be rotated, stretched, or compressed within the structural engineering component 16 to allow a user to review the data for outliers or patterns. Outliers within a given data set can be found and colorized with built in tools to facilitate review by a human. Data can be viewed in a variety of perspectives using structural analytics tools to identify characteristics and behavior of the data with human inspection. In another implementation, in which ordered quartets or quintets are used, each vertical bar can instead be a distribution dependent on one or more other local coordinates in addition to the global coordinates determining the location of the vertical bar. In one example, the global coordinates can represent a geographic location in latitude and longitude. A local coordinate, for example, aligned with latitude, can represent a time of day, with the height of the bar at each point representing an average temperature at that location at a specific time of day. This demonstrates the power of the tool to visualize many parameters simultaneously and all still organized into the context of the overall data set.

In still another implementation, physical loads or perturbations can be applied to the instantiation of the virtual or physical object by the structural engineering component 16. In one example, the object can include vertical bars rising to a height above the surface proportional to the value of the dependent variable at a location depending on two independent variables, but with each bar having a substantially reduced width in one dimension. More generally, this can be done by converting the data elements to physical grains within a fundamental boundary structure of any form. A vibration of sufficient intensity to induce resonance within the thin vertical bars can be applied to the structure as a whole within the structural engineering component 16 and ramped through a plurality of frequencies. It will be appreciated that the resonant frequency of each bar will be a function of its height, and thus the associated dependent variable value, and thus bars representing similar values will resonate at the same applied frequency. Effectively, the structural engineering component 16 can be employed to create layers or clusters of transparent or translucent data and cause features to resonate separately or together, effectively data mining with sound. Anomalies within the data respond to the vibration with patterns similar to vibrational sand diagrams when an appropriate frequency is applied.

By ramping through a defined set of frequencies and combinations of frequencies, it is possible to view subtle patterns on the data set. It will be appreciated that this could also be accomplished using a physical structure, produced via rapid prototyping technology from the defined virtual structure, that is subjected to a precisely controlled physical vibration. The intensity of the resonation is captured by color and patterns emerge dependent on which values are triggered. The results of the values can be explicitly tracked in sophisticated standard metadata files created by the object manipulation component 16. Change detection is one application. Data that is expected to be uniform, such as calibration diagnostics of detectors, can be immediately evaluated for anomalous behavior with built in finite element analysis or similar tools despite the fact that the visual representation of the data set in the software is not does not represent a real-world physical object. In one implementation, data from collocated sources can be embedded in the virtual slab as neighboring points such that anomalies will form patterns making detection feasible, allowing essentially a four-dimensional analysis. Levels of these resonating slabs can be "stacked" in layers creating a physical 3-D object that can be viewed in perspective or from orthogonal vantage points such that patterns from individual layers can be viewed together in resonating translucent layers. This provides an even higher dimension of analysis.

The illustrated system 10 provides a significant increase in the speed of anomaly detection by imposing the simplicity of geometrical structures onto big data in forms that make intuitive sense to the casual observer alongside experienced scientists and analysts. This effectively reduces the big data from multiple sources systematically into tenable bins and places decisions into the hands of decision makers in record time with an unprecedented understanding of the interrelationships of disparate or multifaceted information. Further, since analysis of the data set as a virtual structure can be performed by applying existing structural engineering tools to the virtual structures, novel data analysis can be performed with tools that are available and familiar to non-experts in data analysis.

In another implementation, a melting point of the structure can be varied according to the dependent variable, and simulated heat can be applied to the virtual structure. A user can watch various parts either melt away or heat up in temperature to notice patterns in the data. Optical properties of the structure can be varied, with simulated light applied to the structure. For example, this could be used to demonstrate the absorption and/or rejection of data elements, such as the spectrum of light energy, although a non-physical application is also possible, for example, a structure set up to reject information datastreams that are unwanted. For instance, for a system monitoring IP addresses, events or sites visited, those that would be considered to be white listed would not "stick" to the structure, while the set of information that could contain anomalous or malicious behavior would get trapped. Accordingly, the physical or optical properties of the structure can be used to sort through the data.

Figure 2:
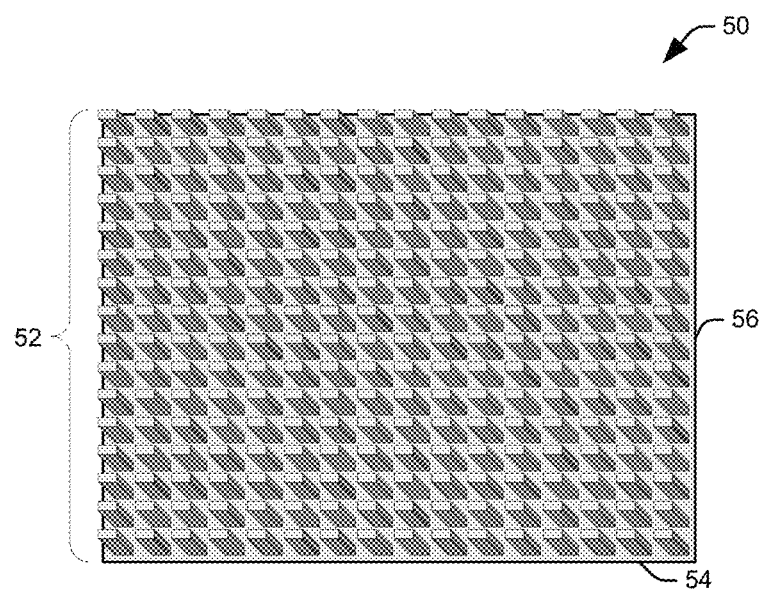
FIG. 2 illustrates a simplified example of a virtual object that might be created by the modeling component.

FIG. 2 illustrates a simplified example of a virtual object 50 that might be created by the modeling component 14. The virtual object 50 includes a two-dimensional base 52 with a plurality of raised structures extending from the base. Each axis 54 and 56 of the two-dimensional base can represent an independent variable within the modeled data, for example, longitude and latitude or time and frequency. The two-dimensional base 52 supports a plurality of raised structures extending from the two-dimensional base, with the position of each raised structure along the two axes 54 and 56 representing values for the dependent variables. The height of each raised structure represents a third variable that is dependent on the two independent variables, such as temperature or signal amplitude. Accordingly, the illustrated virtual object resembles a three-dimensional histogram of the dependent variable over the two independent variables, although it will be appreciated that, unlike a histogram, the object will have defined material properties and the structure will require dimensions for the base and raised structures that are non-infinitesimal in all directions.

The virtual object 50 is instantiated in a structural engineering program to allow for manipulation of the virtual object via structural engineering techniques. For example, the object 50 can be rotated such that the raised structures can be viewed along one of the axes 54 and 56 to allow for initiative identification of outliers within the data set. In one implementation, the raised structures can be made translucent, such that a general sense of the distribution can be determined from the on-axis view according to the combined opacity of the raised structures within a given row or column. In another implementation, the raised structures can be color coded according to their height, such that outlying values can be immediately identified. In still another implementation, structures representing anomalous values, that is, values determined to be outside of an expected range, can be color coded for immediate recognition by a user. In this example, the expected range can be defined via a measure of central tendency (e.g., mean, median, or mode) for the value within the data set modified by a measure of variation (e.g., standard deviation, interquartile range, or a similar value).

In another example, the raised structures can be made to be very thin, such that they vibrate at a resonant frequency. It will be appreciated that the resonant frequency is a function of the height of the structure. To assist a human review of the data, the virtual object 50 can be vibrated within the structural engineering program, with the results of the vibration displayed for a user. The vibration can be stepped through a desired range of frequencies, allowing the user to identify regions of the raised structures vibrating at a same or nearby frequency, and thus represent similar values. In one implementation, sets of frequencies can be vibrated simultaneously to pick out locations of data that have all of some predetermined set of parameters. For instance, applying a set of three frequencies simultaneously, it is possible to identify which locations respond to all three frequencies as opposed to only two, one, or zero. This allows selection of critical information where only when all three frequencies vibrate to indicate a need for a specific action or assist a tactical decision.

Figure 3:
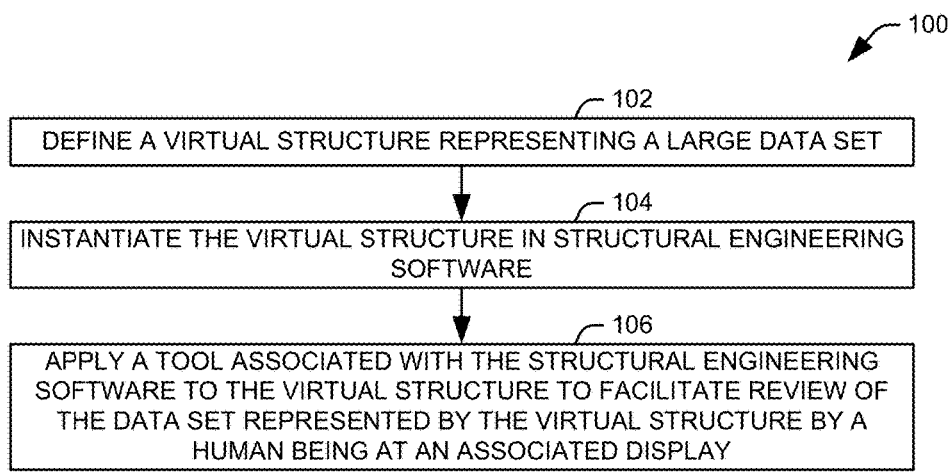
FIG. 3 illustrates one example of a method for displaying large data sets to users as virtual objects.
Figure 4:
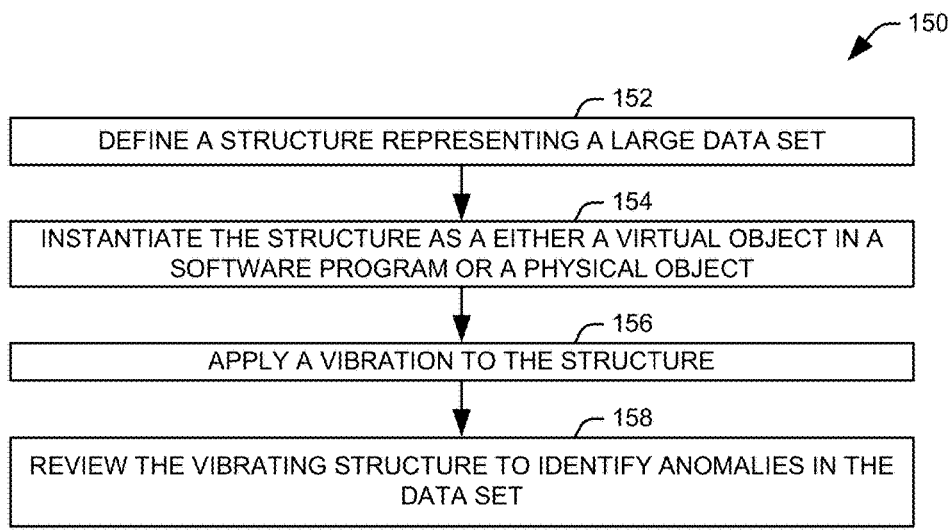
FIG. 4 illustrates a second method for displaying large data sets to users as virtual objects and FIG. 5 illustrates a schematic block diagram of an exemplary operating environment for a system configured in accordance with an aspect of the invention.

In view of the foregoing structural and functional features described above, methods for will be better appreciated with reference to FIGS. 3 and 4. It is to be understood and appreciated that the illustrated actions, in other embodiments, may occur in different orders and/or concurrently with other actions. Moreover, not all illustrated features may be required to implement a method. The fundamental basis of structural engineering software is sophisticated mathematical methods, so in essence, all of the applied virtual physical actions can be thought of as mathematical operations which can be coded. The benefit here is that the cognitive burden of the algorithm developer and/or coder is substantially reduced as the process of the code is developed. It allows each step to be analyzed in real-time during development and visualized in the process. This allows the sharing of otherwise technically complex methods with novice or non-technical audiences.

FIG. 3 illustrates a first method 100 for displaying large data sets to users as virtual objects. At 102, a virtual structure representing a large data set is defined, such that the virtual structure has non-infinitesimal dimensions in all directions and defined material properties and at least one of a dimension of the object and a material property of the object is a function of a parameter from the data set. For example, the virtual structure can have a surface in which the location of a protuberance on the surface represents at least two of values from an ordered set of values, and a height of the protuberance represents at least one additional value from the ordered set. It will be appreciated that the virtual structure, while defined at least partially by values in the data set, can be essentially arbitrary in shape—the data set does not directly represent physical parameters of a real world structure. For example, the virtual structure could represent temperature data taken at various locations, with the latitude and longitude represented in one plane and the temperate represented as the height of discrete structures above the plane. Similarly, a commonly used table showing a correlation matrix can be turned into a geoid utilizing the latitudes to show correlation and anti-correlation and the longitudinal lines to show various pairs. Rather than relying on interpreting dozens or hundreds of numbers in a table, the matrix is efficiently displayed on a sphere. This also could be the starting point of another structural analysis where the mathematical methods are applied to a certain subset of values in an arrangement set by the user. It should also be noted that the virtual structure will have defined material properties and dimensions sufficient to permit analysis in the structurally engineering software. For example, in the implementation in which a rectangular prism having raised protuberances reflecting the dependent variable values, the thickness and material properties of the base of a given structure, while not defined by the data, may be selected to allow for a load to be applied to the structure while remaining sufficient thin to maintain sensitivity of the structure to analyses such as the centroid calculation discussed below.

At 104, the virtual structure is instantiated in structural engineering software. For the purposes of this disclosure, "structural engineering software" includes software packages that implement engineering analysis of structures against applied loads using structural engineering principles. A non-exhaustive list of examples of structural engineering software includes PATRAN, NASTRAN, NX, SAFI, Visual Analysis, SkyCiv, RFEM, and SAP2000. It should be noted that these tools are built to make complex mathematical methods easy to use and therefore all applications inside these software are programmable. Constructing the data into a structure first however, enables the outputs of such programs to be represented visually with very little time and work.

At 106, a tool associated with the structural engineering software is applied to the virtual structure to facilitate review of the data set represented by the virtual structure by either contemporaneously a human being at a display associated with the structural engineering software or exported as a file associated with one or more commonly used viewers, such as portable document format (.pdf) files, where the data visualization can be manipulated and/or annotated by the human being during a later review. In one example, the applied tool can include a centroid of data calculation used to compare centroids across multiple objects representing respective data sets. This can be used to find an anomalous data set, for example, as might be produced by a sensor system that is not operating within desired parameters. The inventors have found that data sets that cannot easily be distinguished via visual inspection, common representative statistics, or calculation of their volume under a curve can be quickly distinguished by calculating the centroids of their respective virtual structures. Accordingly, anomalous data sets, and thus, anomalous equipment, can be readily located through application of a structural engineering tool. In another example, described in more detail with reference to FIG. 4, is a vibrational analysis tool.

FIG. 4 illustrates a second method 150 for displaying large data sets to users as virtual objects. At 152, a structure representing a large data set is defined. It will be appreciated that the structure, while defined at least partially by values in the data set, can be essentially arbitrary in shape—the data set does not directly represent physical parameters of a real world structure—and the virtual structure will have defined material properties and dimensions sufficient to permit analysis in the structural engineering software. In one example, the structure can have a surface in which the location of a protuberance on the surface represents at least two of values from an ordered set of values, and a height of the protuberance represents at least one additional value from the ordered set.

At 154, the defined structure is instantiated as one of a virtual object and a physical object in a structural engineering software program or standalone program coded in a language such as C, C# or python exactly to perform the applications inside such a program. Coding in a language without the use of a virtual structure to reference would be cognitively prohibitive until the underlying relationships can be abstracted with a few examples. In one implementation, a virtual structure is instantiated in structural engineering software for analysis via various structural engineering tools associated with the software. In another implementation, a physical object representing the defined structure can be produced via 3-D printing or other rapid prototyping techniques.

In another implementation, the analysis can be performed using standalone analytics derived from the object and available structural engineering tools. The inventors have determined that the virtual structure can be used to model the analytics needed to get the desired results reducing or removing much of the cognitive burden associated with comparisons and analytics between n-dimensional parameters. The process, once defined can be coded such that the human in the loop is no longer needed. For example, the mathematical methods available in an FEM analysis can be exploited for conducting correlative matrix components in n-dimensional directions using one or groups of data points. These are very easily selected by a user with the click of a mouse or drawing a loop around the elements of choice. Once the matrices are set up such that they are functional to getting the desired pattern or information, they can then be coded by following the steps taken by hand. Again, it should be noted that the cognitive burden is drastically reduced for the user, analyst, algorithm developer or casual viewer. The structure is used as an aid to modeling or writing standalone algorithms.

At 156, a vibration is applied to the structure at a selected frequency. In one implementation using a virtual object, the vibration is applied via a vibration analysis tool associated with the structural engineering software. In another implementation using a physical object, the vibration can be physically applied to the object, for example, using an electrodynamic shaker or ultrasonic transducer. In one implementation, the vibration is applied sequentially at each of a plurality of frequencies, such that the vibration is stepped through a selected range of frequencies At 158, the vibrating structure is reviewed to identify anomalies within the data set. In one example, the object can include vertical bars rising to a height above the surface proportional to the value of the dependent variable at a location depending on two independent variables, but with each bar having a substantially reduced width in one dimension. It will be appreciated that the resonant frequency of each bar will be a function of its height, and thus the associated dependent variable value, and thus bars representing similar values will resonate at the same applied frequency. Anomalies within the data are represented in the structure as patterns similar to vibrational sand diagrams when an appropriate frequency is applied. By reviewing which features to resonate separately or together, it is possible to identify meaningful patterns within the data. In general, this analysis can be performed using any structure in which the data elements are converted to physical grains within a fundamental boundary structure.

Figure 5:
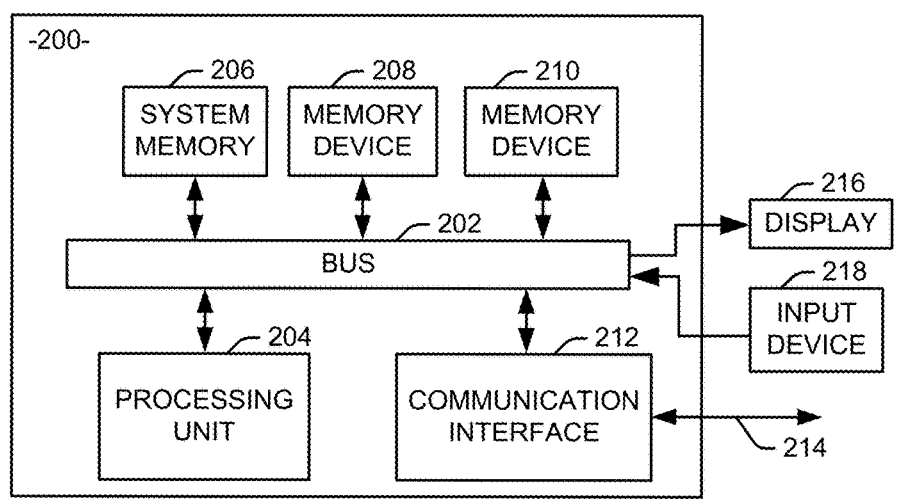

FIG. 5 is a schematic block diagram illustrating an exemplary system 200 of hardware components capable of implementing examples of the systems and methods disclosed in FIGS. 1-4. The system 200 can include various systems and subsystems. The system 200 can be a personal computer, a laptop computer, a workstation, a computer system, an appliance, an application-specific integrated circuit (ASIC), a server, a server blade center, a server farm, etc.

The system 200 can include a system bus 202, a processing unit 204, a system memory 206, memory devices 208 and 210, a communication interface 212 (e.g., a network interface), a communication link 214, a display 216 (e.g., a video screen), and an input device 218 (e.g., a keyboard and/or a mouse). The system bus 202 can be in communication with the processing unit 204 and the system memory 206. The additional memory devices 208 and 210, such as a hard disk drive, server, standalone database, or other non-volatile memory, can also be in communication with the system bus 202. The system bus 202 interconnects the processing unit 204, the memory devices 206-210, the communication interface 212, the display 216, and the input device 218. In some examples, the system bus 202 also interconnects an additional port (not shown), such as a universal serial bus (USB) port.

The processing unit 204 can be a computing device and can include an application-specific integrated circuit (ASIC). The processing unit 204 executes a set of instructions to implement the operations of examples disclosed herein. The processing unit can include a processing core.

The additional memory devices 206, 208, and 210 can store data, programs, instructions, database queries in text or compiled form, and any other information that can be needed to operate a computer. The memories 206, 208 and 210 can be implemented as computer-readable media (integrated or removable) such as a memory card, disk drive, compact disk (CD), or server accessible over a network. In certain examples, the memories 206, 208 and 210 can comprise text, images, video, and/or audio, portions of which can be available in formats comprehensible to human beings.

Additionally or alternatively, the system 200 can access an external data source or query source through the communication interface 212, which can communicate with the system bus 202 and the communication link 214.

In operation, the system 200 can be used to implement one or more parts of a data analysis system in accordance with the present invention, including, some implementations, the source interface 12, the modeling component 14, and the structural engineering component 16 of the system 10 of FIG. 1. Computer executable logic for implementing these functions resides on one or more of the system memory 206, and the memory devices 208, 210 in accordance with certain examples. The processing unit 204 executes one or more computer executable instructions originating from the system memory 206 and the memory devices 208 and 210. The term "computer readable medium" as used herein refers to a medium that participates in providing instructions to the processing unit 204 for execution, and can, in practice, refer to multiple, operatively connected apparatuses for storing machine executable instructions.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A system for analyzing large data sets comprising:
a source interface that receives a data set that does not directly represent physical parameters of a real world structure as a set of ordered n-tuples representing at least two independent variables and at least one dependent variable;
a modeling component that defines a three-dimensional structure representing the data set and instantiates the defined three-dimensional structure as an object comprising one of a virtual object and a physical object, the object having non-infinitesimal dimensions in all directions and defined material properties such that that at least one of a dimension of the object, an optical property of the object, and a material property of the object at a location representing the at least two independent variables is a function of the dependent variable; and
an object manipulation component that manipulates the object to facilitate review of the data set represented by the object, the manipulation of the object comprising one of a kinematic perturbation, application of heat, application of light, and application of a structural engineering tool to the object.

2. The system of claim 1, wherein the modeling component comprises a rapid prototyping component to produce the object as a physical object representing the defined three-dimensional structure.

3. The system of claim 2, wherein the object manipulation component comprises one of an electrodynamic shaker and an ultrasonic transducer that applies a vibration to the physical object at a selected frequency.

4. The system of claim 1, wherein the object is a virtual object, the object manipulation component comprises a structural engineering software program stored on a non-transitory computer readable medium and an operatively connected processor for executing the structural engineering software program, and the system further comprises a display to display the manipulated instantiation of the virtual object.

5. The system of claim 4, wherein the virtual object comprises a two-dimensional base with a plurality of raised structures extending from the base, such that the position of each raised structure on the base represents values for at least two independent variables, and a dimension of each raised structure represents a value for at least a third variable that is dependent on the two independent variables.

6. The system of claim 4, wherein the virtual object comprises an icosahedron, with each of twelve poles defined by the icosahedron representing a parameter of the data set.

7. The system of claim 4, wherein the virtual object comprises an sphere, with a plurality of raised structures extending from the base, such that the position, in geographic coordinates, of each raised structure on a surface of the sphere represents values for at least two independent variables, and the height of each raised structure represents a value for at least a third variable that is dependent on the two independent variables.

8. The system of claim 4, wherein the object manipulation component applies a structural engineering tool to the object to calculate a centroid of the object.

9. The system of claim 1, wherein the object manipulation component applies vibration to the object at a selected frequency.

10. The system of claim 9, wherein the selected frequency is ramped through a range of frequencies.

11. The system of claim 1, wherein the object is a virtual object and the manipulation component simulates application of heat to the virtual object.

12. The system of claim 1, wherein the object is a virtual object and the manipulation component simulates application of light to the virtual object.

13. A method for analyzing large data sets, the method comprising:
    defining a virtual structure representing a large data set, such that the virtual structure has non-infinitesimal dimensions in all directions and defined material properties and at least one of a dimension of the virtual structure and a material property of the virtual structure is a function of a parameter associated with the data set and at least one of a dimension of the virtual structure and a material property of the virtual structure is not defined by the data set;
    instantiating the virtual structure in structural engineering software, the structural engineering software being stored on a non-transitory computer readable medium and executed by an associated processor; and
    applying at least one structural engineering tool from the structural engineering software to the virtual structure to facilitate review of the data set by a human being at an associated display.

14. The method of claim 13, wherein the at least one structural engineering tool includes a centroid of data tool that determines a centroid of the virtual structure.

15. The method of claim 14, wherein the virtual structure is a first virtual structure of a plurality of virtual structures representing respective data sets, and the method further comprises:
    applying the centroid of data tool to each of the plurality of virtual structures to determine a centroid for each virtual structure; and
    comparing the centroids for the plurality of virtual structures to determine an anomalous data set of the data sets represented by the plurality of virtual structures.

16. The method of claim 13, wherein at least one structural engineering tool includes a vibrational analysis tool that provides vibration of the virtual object at a selected frequency.

17. A method for analyzing large data sets, the method comprising:
    defining a structure representing a large data set, such that the structure has non-infinitesimal dimensions in all directions and defined material properties and at least one of a dimension of the structure and a material property of the structure is a function of a parameter associated with the data set, the structure comprising a two-dimensional base with a plurality of raised elements extending from the base, such that the position of each raised element on the base represents values for at least two independent variables, and a dimension of each raised element represents a value for at least a third variable that is dependent on the two independent variables;
    instantiating the structure as one of a virtual object in a software program and a physical object;
    applying a vibration to the structure at a selected frequency; and
    reviewing the vibrating structure to identify anomalies within the data set.

18. The method of claim 17, wherein instantiating the structure comprises generating a physical object at a rapid prototyping component.

19. The method of claim 17, wherein instantiating the structure comprises instantiating the virtual object in the structural engineering software program, and applying the vibration to the structure comprises applying a vibration analysis tool associated with the structural engineering software program to the virtual object.

20. The system of claim 17, wherein applying the vibration to the structure at a selected frequency comprises applying the vibration at a plurality of frequencies such that the vibration is stepped through a selected range of frequencies.

* * * * *